United States Patent [19]

Kikuchi

[11] Patent Number: 5,780,849
[45] Date of Patent: Jul. 14, 1998

[54] APPARATUS FOR DETECTING OBJECTS TO BE TRANSFERRED FOR USE IN SEMICONDUCTOR DEVICE FABRICATION APPARATUS

[75] Inventor: Hisashi Kikuchi, Esashi, Japan

[73] Assignee: Tokyo Electron, Ltd., Tokyo-to, Japan

[21] Appl. No.: 975,293

[22] Filed: Nov. 20, 1997

Related U.S. Application Data

[63] Continuation of Ser. No. 595,285, Feb. 1, 1996, abandoned.

[30] Foreign Application Priority Data

Feb. 6, 1995 [JP] Japan ................................ 7-041233

[51] Int. Cl.⁶ ........................................... G01D 5/34
[52] U.S. Cl. ........................ 250/231.13; 250/231.18
[58] Field of Search ..................... 250/231.13, 231.18, 250/237 G

[56] References Cited

U.S. PATENT DOCUMENTS

| | | | |
|---|---|---|---|
| 4,224,603 | 9/1980 | Lallemand | 340/347 P |
| 5,148,020 | 9/1992 | Machida | 250/237 G |
| 5,235,181 | 8/1993 | Durana et al. | 250/231.18 |
| 5,291,025 | 3/1994 | Smith | 250/237 G |
| 5,423,503 | 6/1995 | Tanaka et al. | 248/176 |

*Primary Examiner*—Edward P. Westin
*Assistant Examiner*—Kevin Pyo
*Attorney, Agent, or Firm*—Beveridge, DeGrandi, Weilacher & Young, LLP

[57] ABSTRACT

An apparatus for detecting objects to be transferred includes a wafer detecting unit having photo-sensors which scan a carrier moved up and down on a lift stage to detect wafers held on respective stages in the carrier, and an indication device provided vertically downward on the lift stage and including light-passing portions and non-light passing portions vertically arranged. The indication device traverses optical axes of a reading unit with, e.g., photo-emitting/ detecting device to thereby obtain information of vertical position of a carrier, and, based on combinations of photo-detection signals from the wafer detecting units, absence and presence of wafers on the respective stages are recognized. This arrangement makes it possible that absence and presence of semiconductor wafers on the respective stages in a carrier are quickly and accurately detected, and even when the lift stage is stopped during detection, halting the detection, the detection is resumed at the halted position without returning the carrier to its initial position.

2 Claims, 7 Drawing Sheets

F I G. I

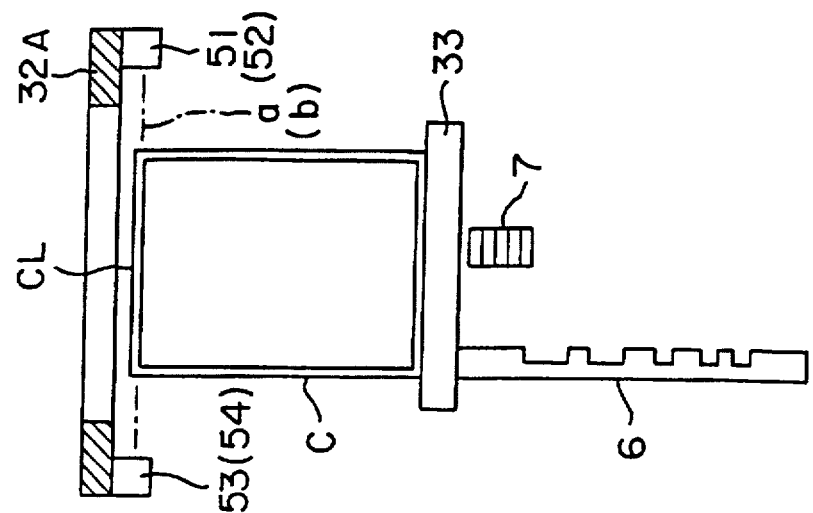
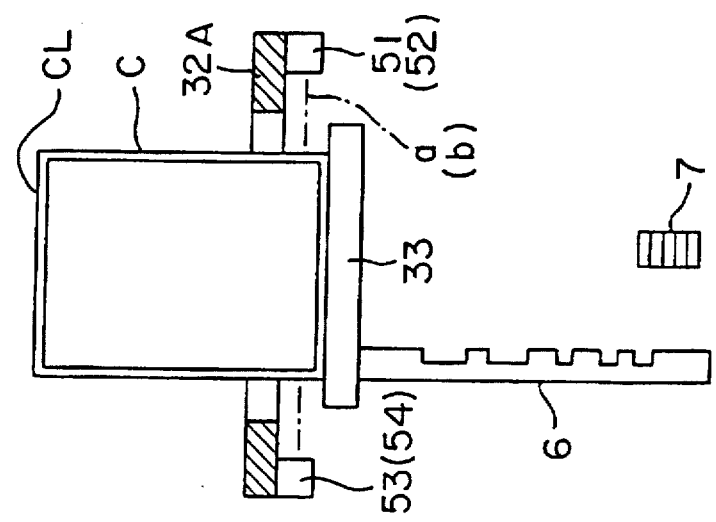
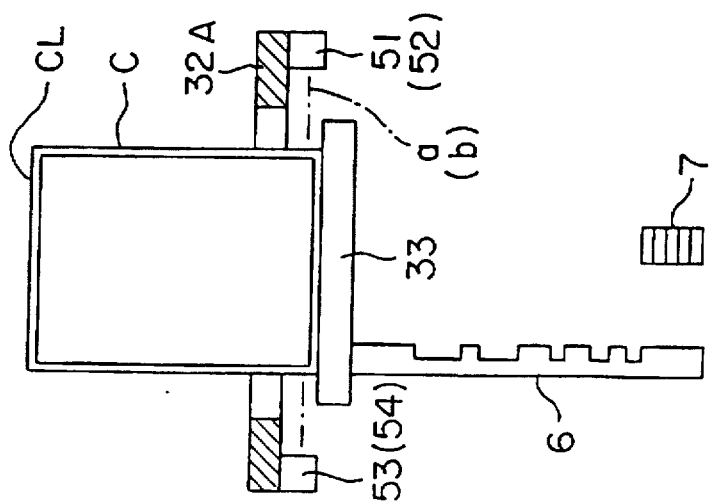

APPARATUS FOR DETECTING OBJECTS TO BE TRANSFERRED FOR USE IN SEMICONDUCTOR DEVICE FABRICATION APPARATUS

This application is a continuation, of application Ser. No. 08/595,285, filed Feb. 1, 1996, which application is entirely incorporated herein by reference, now abandoned.

BACKGROUND OF THE INVENTION

The present invention relates to an apparatus for detecting objects to be transferred for use in a semiconductor device fabrication apparatus.

In a semiconductor device fabrication apparatus semiconductor wafers (hereinafter called "wafers") are transferred between processing stations, and stored in containers of, e.g. Teflon (usually called "a wafer carrier" or "a wafer cassette") having the top and bottom ends thereof opened and a number of slots (holding grooves). At a processing station the container holding 25 sheets of wafers vertically one above another, for example, is carried onto a carrier boat, and then at this station or after moved to another place, the wafers held in the carrier are transferred to a position, e.g., the wafer boat or a load-lock chamber by wafer transfer means (a transfer robot).

In thus transferring the wafers, a fork of the transfer means is inserted into the slots through an opening in the front of the carrier in its standing posture, i.e., with the wafers arranged vertically one above another lift the wafers on the undersides. At this time it is necessary to detect the presence of wafers in the respective holding grooves on the respective stages (respective slots) to perform the so-called mapping. That is, it is not always that wafers are carried into a processing station, held in the carrier in a prescribed number and sequence; an accident may occur in a processing station on a preceding stage, or test wafers may be sampled for inspection of the processing at a preceding stage. In such absence of wafers, it is necessary that a controller of the system detects on which stages the wafers are absent and present, and give, in advance, an instruction to the wafer transfer means.

In the conventional method for detecting the absence and presence of wafers in the carrier, as exemplified in FIG. 10, a photo-emitting element 11 and a photo-detecting element 12 are so disposed that the elements 11, 12 can sandwich a carrier C at the front and the back of the carrier C, and a lift stage 1 is moved vertically by a ball screw mechanism 13 driven by a pulse motor M to scan wafers W vertically from the top stage to the bottom stage by an optical axis L. Pulse amounts from an encoder provided on the pulse motor for driving the ball screw mechanism 13, and ON/OFF signals from the photo-detecting element 12 are supplied to a control unit 14, and based on the pulse amounts, slot numbers passing the optical axis L are recognized to detect the absence and presence of the wafers on the respective slots of the carrier C.

In such conventional detecting method, height position information of the carrier C is obtained based on feed amounts of the ball screw mechanism 13, i.e., pulse amounts of the encoder, and accordingly computation by software is necessary. The computation takes time, which is a factor for low throughputs. The processing speed of the controller varies with types of the controller, which lowers freedom degrees of design. This is also a problem. Every time that the motor M should be stopped due to breakdown of the electric power during the mapping, the carrier C will have to be returned to its initial position to initialize the mapping, which is a barrier to improvement of throughputs.

SUMMARY OF THE INVENTION

An object of the present invention is to provide an apparatus for detecting objects to be transferred (wafer counting apparatus) which can detect at high speed the absence and presence of objects to be transferred on respective stages in a container, such as a carrier or the like, and which, even when a motor is stopped during mapping, can quickly resume the mapping.

An apparatus for detecting objects to be transferred according to the present invention, in which a detecting unit for detecting the objects to be transferred is moved up and down by lift means with respect to a container for holding the objects-to-be-transferred in the shape of a plate on respective stages one above another at a vertical interval to thereby move the detecting unit with respect to the objects to be transferred is characterized by indication means disposed on the lift means, and including optical elements which have different photo-detection capacities from one another and are arranged vertically one on another; and reading means for reading photo-detected amounts of the optical elements of the indication means, optical axes of the reading means traversing a lift passage of the indication means, the indication means being so arranged that indications read by the reading means indicate vertical positions of the container in a detection region of the detection means.

An apparatus for detecting objects to be transferred according to the present invention, in which a detecting unit for detecting the objects to be transferred is moved up and down by lift means with respect to a container for holding the objects-to-be-transferred in the shape of a plate on respective stages one above another at a vertical interval to thereby move the detecting unit with respect to the objects to be transferred is characterized by:

reading means disposed on the lift means; and indication means including optical elements arranged vertically one on another and having different photo-detection capacities, and disposed in a vertical passage of optical axes of reading means so that photo-detected amounts of the optical elements are read by the reading means, the indication means being so arranged that indications read by the reading means indicate vertical positions of the container in a detection region of the detection means.

The present invention is characterized in that the reading means comprises a plurality of photoemitting/detecting means vertically arranged, and the indication means comprises a combination of light-passing portions and non-light-passing portions.

The present invention is characterized in that the indication means comprises a combination of reflecting portions and non-reflecting portions.

In the apparatus for detecting objects to be transferred according to the present invention, the container is lifted with the detecting unit for objects to be transferred set stationary, the rise of the container positions different optical elements on the optical axes of the reading means, so that the optical elements on the optical axes is read to obtain information of a vertical position of the container in the detection region of the detecting unit. In a case that the detecting unit is photo-sensors, when the first stage in the container is located on the optical axes of the photo-sensors, the optical element of the indication means on the optical axes of the reading means corresponds to the first stage. Because the reading means comprises a plurality of photoemitting/detecting means vertically arranged, a combination of ON and OFF of photo-detection signals outputted by these photo-emitting/detecting means correspond to a code of the first stage.

Thus according to the present invention, when absence and presence of objects to be transferred are detected by the detecting unit for the object to be transferred, what ordinal number of stage the information belongs to can be recognized by the hardware. This results in quick processing, and makes it possible that even when the electric source power is broken down during the detection, the detection can be resumed at the halt position without returning the container to the initial position.

BRIEF DESCRIPTION OF THE DRAWINGS

FIG. 8A to 8C are each views explaining the operation of the embodiment of the wafer count of the present invention.

DETAILED DESCRIPTION OF MOST PREFERRED EMBODIMENTS

Figure 1:
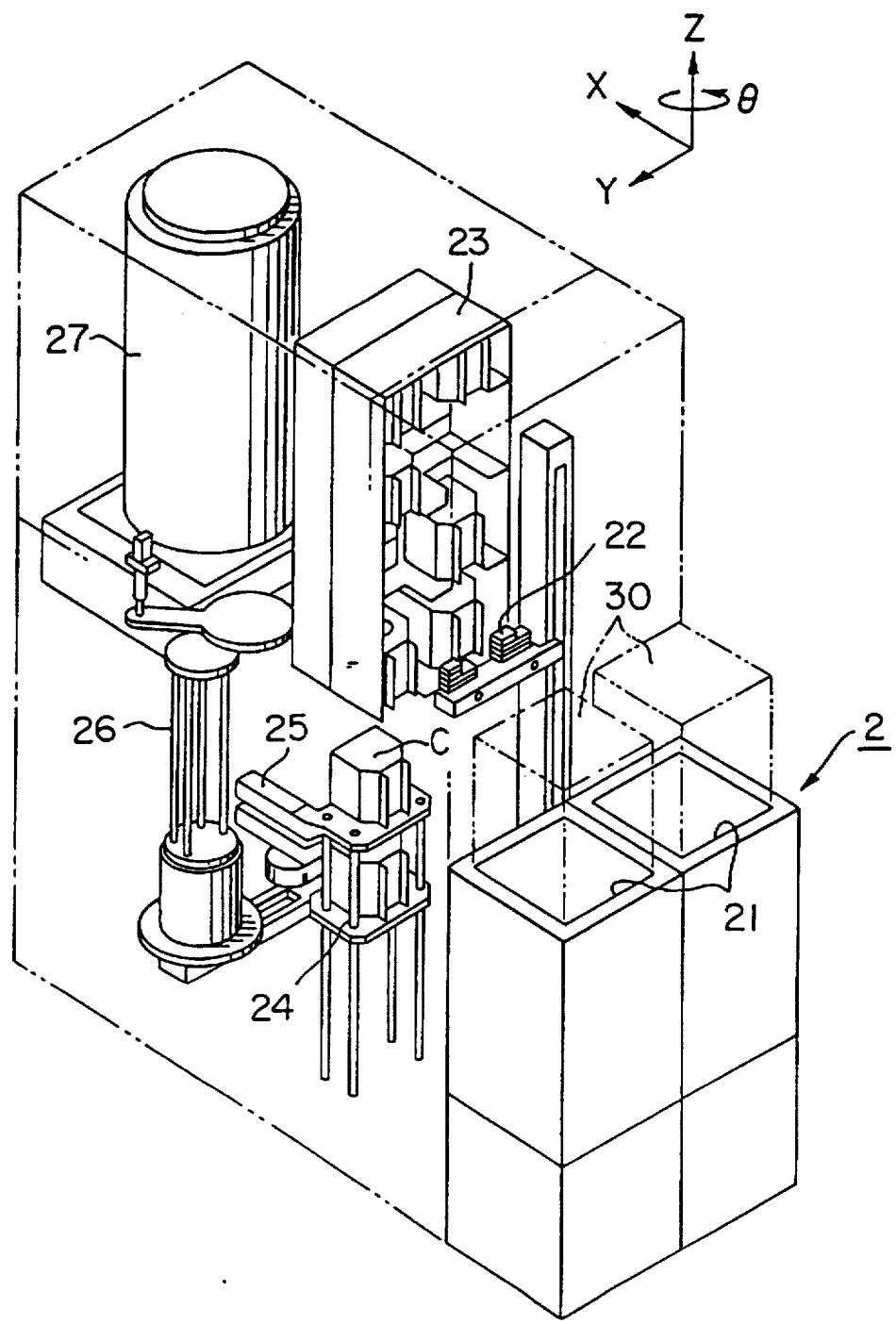
FIG. 1 is a perspective view of a vertical heat treatment apparatus as a semiconductor device fabrication device with the wafer count for objects to be transferred according to one embodiment of the present invention.

The apparatus for detecting objects to be transferred according to the present invention will be explained by means of an embodiment in which the apparatus is disposed at a loading/unloading port of a vertical processing apparatus. First, with reference to FIG. 1, the general structure of the vertical heat treatment apparatus the present invention is applied to will be briefed. Reference numeral 2 represents the loading/unloading port of a carrier C, a container which holds, for example, 25 sheets of wafers one above another. The loading/unloading port 2 has, for example, two transfer ports 21 in the top thereof, which transfer the carrier C to and from an AGV (Automated-Guided Vehicle), which is not shown here.

The carrier C loaded into the vertical processing apparatus through the loading/unloading port 2 is transferred onto a wafer transfer stage 24 via, e.g., carrier storage shelves 23 by a carrier transfer mechanism 22 which is movable in X, θ, and Z directions. The wafers in the carrier C on the wafer transfer stage 24 are transferred onto a wafer boat 26 by a wafer transfer mechanism 25 which is movable in X and θ directions. The wafer boat 26 is lifted by a boat elevator (not shown) to be loaded into a heat treatment furnace 27 for a heat treatment.

Figure 2:
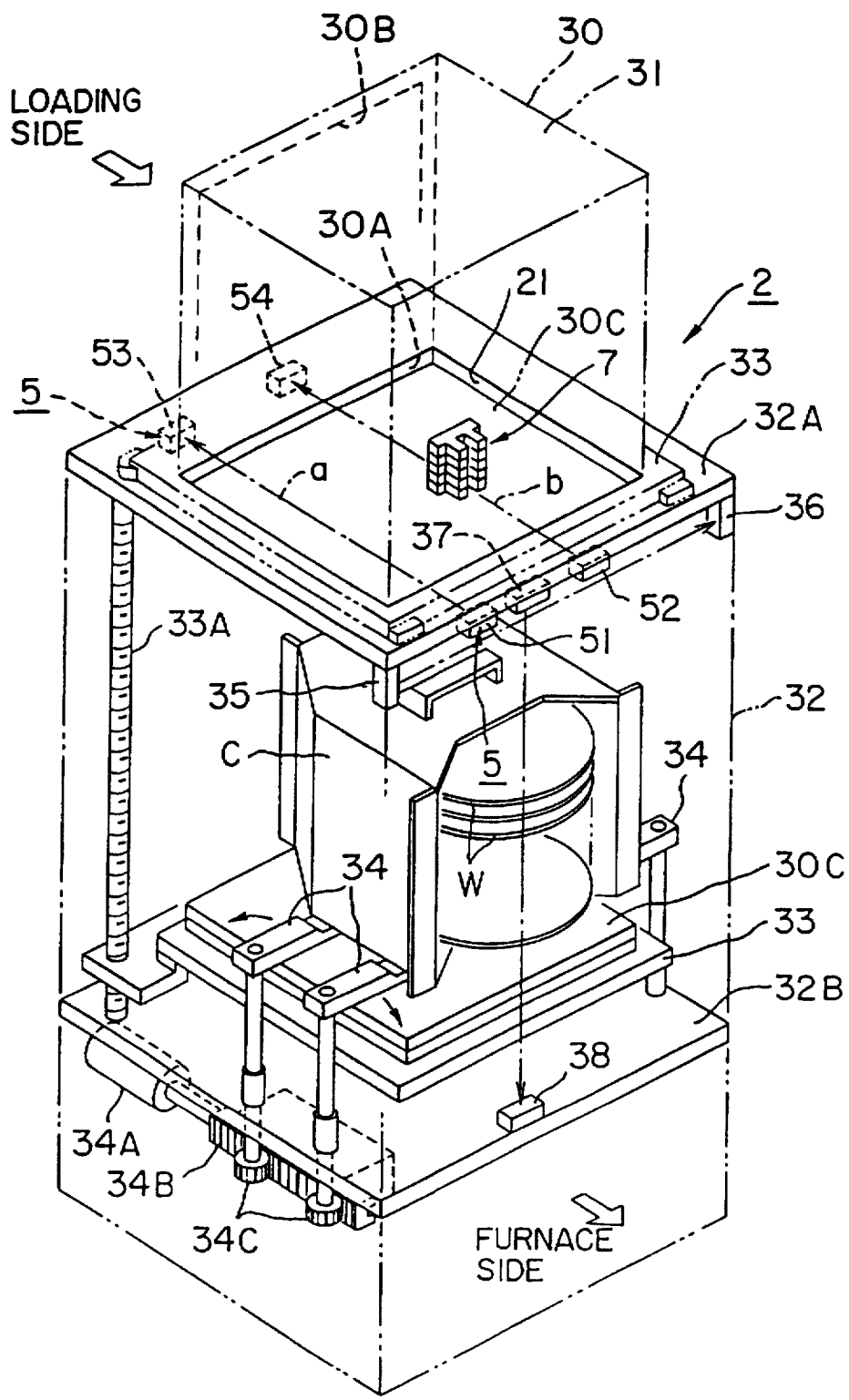
FIG. 2 is a perspective view of the wafer count of FIG. 1.

The apparatus for detecting objects to be transferred, e.g., a wafer detecting apparatus, according to the present embodiment of the present invention is incorporated in the loading/unloading port 2 as shown in FIG. 2. The transfer ports 21 are formed in a top plate 32A of the loading/unloading port 2, and a box-shaped cover 30 is placed on the top plate 32A and fixed thereon by claws (not shown). The AGV not shown is provided near the cover 30. The cover 30 has an opening formed in the bottom surface through which the cover 30 is in communication with the transfer port 21, and an opening 30b formed in the inner surface as viewed in FIG. 2, through which a carrier C is transferred from the AGV body. Below a delivery chamber 31 enclosed by the cover 30 and disposed on an outer lid 30C the loading/unloading port 2 has a transfer chamber 32 in which a carrier C is transferred to and from the carrier transfer mechanism 22.

In the transfer chamber 32 there are disposed a lift stage 33 which moves a carrier C up and down between the delivery chamber 31 and the transfer chamber 32, led along a guide (ball screw) 33A by a lift mechanism not shown, and four hold arms 34 (one of which is hid by the carrier C in FIG. 2) which receive and hold a carrier C moved down on the lift stage 33. The hold arms 34 are rotated toward the front or the back as shown by pinions 34C rotated by a rack 34B which is reciprocated in the direction of the arrow by an air cylinder 34A, so that the hold arms 34 are brought into their closed state as shown in FIG. 2 (the hold arms disposed nearer to the front are brought parallel with those disposed nearer to the back) when the lift stage 33 with a carrier C mounted on is lowered into the transfer chamber, and receive the carrier C. The hold arms 34 are pivoted on a bottom plate 32B of the transfer chamber 32.

Figure 3:
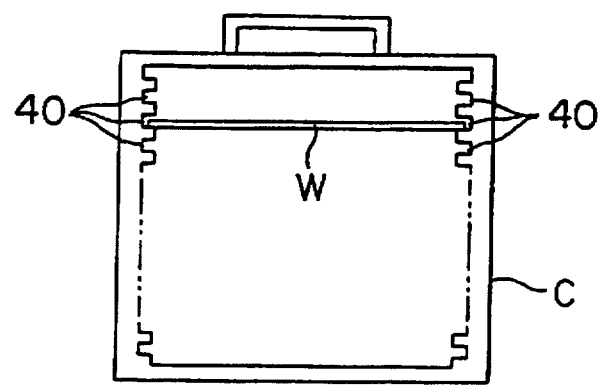
FIG. 3 is a front view of a wafer carrier to be detected by the wafer count of the present invention as viewed from the side of the wafer load/unload.

As shown in FIGS. 2 and 3, when the carrier C is laid on one side surface thereof (with the wafers being horizontal), the front and the back surfaces thereof are opened, and the wafers W are loaded/unloaded into and out of the carrier C through the front surface (on the side of a furnace in FIG. 2). Holding grooves 40, the so-called slots, for holding wafers W at peripheral portions thereof are formed in the insides of both side surfaces of the carrier C one above another on, e.g., 25 stages. On the upper end of the transfer chamber 32 there is provided a wafer detecting unit 5 for detecting the absence and presence of wafers W on the respective stages in the carrier C.

The wafer detecting unit 5 includes two photo-emitting means 51, 52 disposed opposed to each other on the front side of the lift passage of the carrier C, and two photo-detecting means 53, 54 disposed opposed to each other on the back side of the lift passage. Two sets of sensors (51, 53; 52, 54) constituted by the photo-emitting means and photo-detecting means are so positioned that optical axes (a, b) of the sensors traverse the lift passage through the openings in the front and the back surfaces of a carrier C on the lift stage 33 and are spaced from each other by, e.g., 45 mm to the left and right from the center of the carrier C (i.e., the optical axes are spaced from each other to the left and right by 90 mm).

Figure 4:
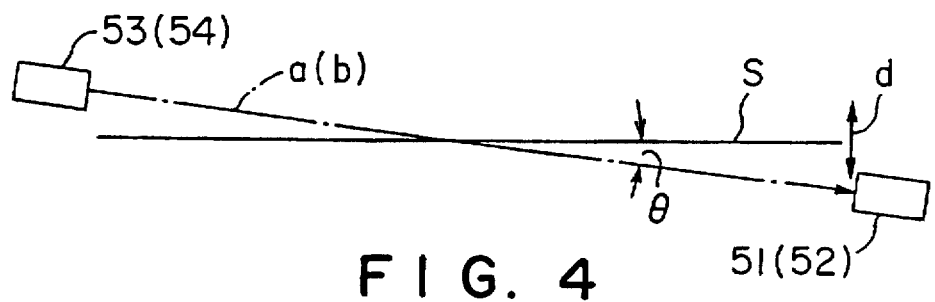
FIG. 4 is a view explaining a positional relationship between the wafer detecting unit and the surface of a wafer held by holding grooves in the wafer carrier.

In the relationship of the positions of the photo-emitting means 51 (52) and the photo-detecting means 53 (54) in the vertical direction, as shown in FIG. 4, the optical axes a (b)

is inclined by θ to a plane S interconnecting the middles of the opposed left and right slots in a carrier C mounted on the lift stage 33 (i.e., the surfaces of wafers W normally held in the slots), and the inclination is so set that, for example, a vertical distance between the center of a photo-emitting surface of the photo-emitting means 51 (52) and that of a photo-detecting surface of the photo-detecting means 53 (54) is 3 mm.

Figure 5:
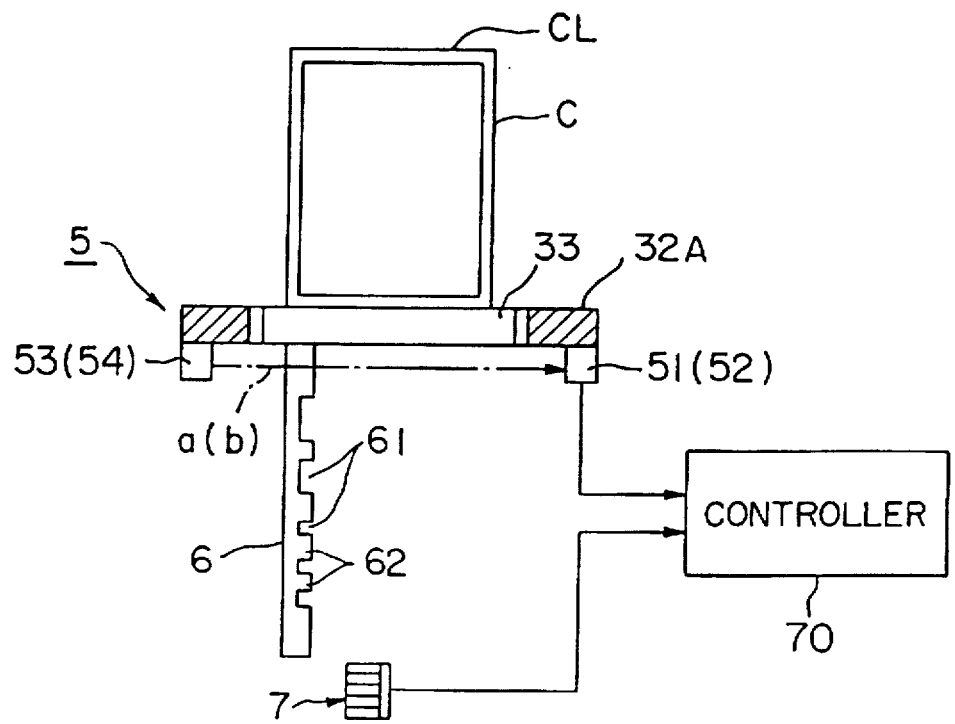
FIG. 5 is a schematic front view of a major part of the wafer count of the present invention.
Figure 6:
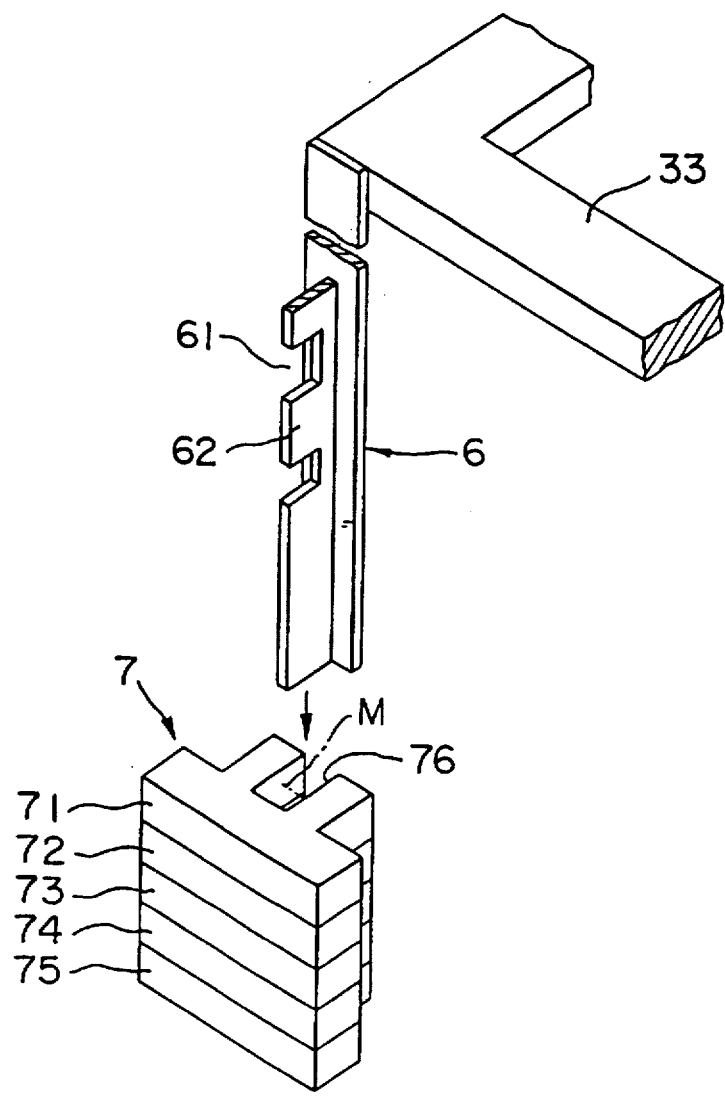
FIG. 6 is the indication means and the reading means of the wafer count of the present invention.

As shown in FIGS. 5 and 6, indication means (photo-shielding plate) 6 (not shown in FIG. 2) in the form of a band-shaped plate which indicates a vertical position of a carrier C is provided downward on the backside of the lift stage 33 near the periphery thereof. On the other hand, as shown in FIG. 6, in the transfer chamber there is provided reading means 7 including five photo-emitting/detecting means 71–75 which are arranged one on another and each of which is, e.g., a combination of photo-emitting means and photo-detecting means. The reading means 7 is so arranged that optical axes M of the respective photo-emitting/ detecting means 71–75 traverse the lift passage of the indication means 6.

That is, in the reading means there is formed a recess 76 through which the indication means 6 passes, and the optical axes M are formed. In FIG. 5, for convenience, the indication means 6 and the reading means 7 are shown separate from each other.

As shown in FIGS. 5 and 6, a plurality of rectangular recesses 61 as light-passages are formed at intervals on one side of the indication means 6. Portions of said one side left uncut which are upper and lower of the respective light-passage portions (recesses) 61 define non-light-passing portions 62.

Figure 7:
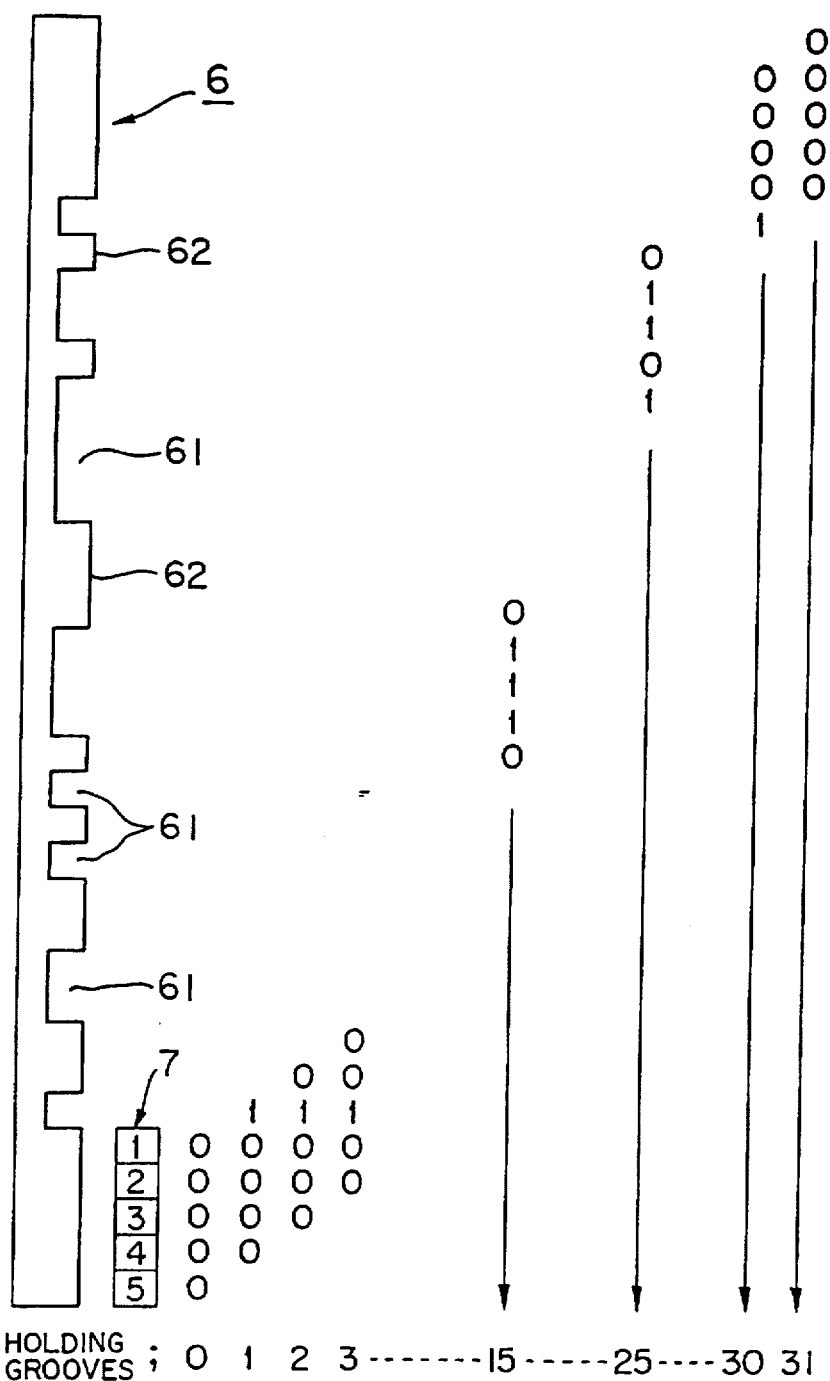
FIG. 7 is a view explaining the indication means and codes outputted by the reading means of the wafer count of the present invention.

FIG. 7 shows an example of the indication means 6.

A vertical length of the respective light-passing portions 61 and the respective non-light-passing portions 62 is integral times a vertical length (one pitch, e.g., 6.35 mm with a spacer sandwiched) of each of the photo-emitting/detecting means. When a light-passage 61 is located at a position where the light-passage 61 traverses the optical axis M of the reading means 7, the photo-detecting means of the photo-emitting/detecting means detects the light, and a photo-detection signal is ON, and when a non-light-passing portion 62 is at the position where the non-light-passing portion 62 traverses the optical axis M, the photo-detecting means does not detect the light, and a photo-detecting signal is OFF.

Thus, combinations of ON and OFF of photo-detection signals from the respective photo-emitting/detecting means 71–75 are determined in accordance with vertical positions of the indication means 6. FIG. 7 exemplifies correspondence of vertical positions of the indication means 6 with respect to the reading means 7 to combinations of photo-detection signals from the respective photo-emitting/ detecting means 71–75 (corresponding to 1–5 in the frames). "0" is OFF, and "1" is ON.

In the shown example, the non-light-passing portion 62 on the bottom end of the indication means 6 is arranged so as to block all the optical axes of the reading means 7 when the 0-th holding groove of the carrier C, i.e., the bottom plate of the carrier C is on the optical axes a (b) of the wafer detecting unit 5. The light-passing portions 61 of the indication unit 6 and the non-light-passing portions 62 thereof are so arranged that ordinal numbers (n-th from the top) of the holding grooves 40 correspond to codes of combinations of the photo-detection signals "1" and "0" from the photo-emitting detecting means 71–75 when the respective holding grooves 40 of the carrier C are positioned on the same levels of the optical axes a (b) of the holding grooves 40 of the carrier C.

To give an example, when the first holding grooves 40 from the bottom of the carrier C is positioned on the same level as the optical axes a (b) of the wafer detecting unit, as shown in FIG. 7, the code is (10000), the code being (01101) for the 25th holding groove 40. In the present embodiment, however, the indication means 6 is arranged so that a code (00001) for the phantom 30th holding groove corresponding to a position of the upper surface of the carrier C is outputted to thereby enable the detection even when the upper end plate of the carrier C is on the same level of the optical axes a (b).

On the other hand, as shown in FIG. 5, the wafer detecting apparatus according to the present embodiment includes a control unit 70 which receives signals from the photo-detecting means 53 (54) for the detection of absence and presence of wafers W, and signals from the reading means 7. The control unit 70 gives a vertical position of the carrier C, based on signals from the reading means 7, and detects absence and presence of wafers W, based on signals from the wafer detecting unit 5. Thus, absence and presence of wafers W on the respective stages in the carrier C is recognized, i.e., mapping is conducted.

As shown in FIG. 2, photo-emitting means 35 and photo-detecting means 36 are disposed respectively on the left and the right of an upper part of the interior of the transfer chamber 32 confront the lift passage so that an optical axis of the photo-emitting means 35 is located at a position where the front opening of the carrier C confronts the lift passage. The photo-emitting means 35 and the photo-detecting means 36 are a sensor for detecting wafers W coming out of a carrier C, and the photo-emitting means 37 and the photo-detecting means 38 are a sensor for detecting whether the orientation flats of wafers W are located on the front side (the side of a furnace).

Next, the operation of the above-described embodiment will be explained. The automated-guided vehicle (AGH, not shown) whose interior has been purged with an inert gas arrives at the loading/unloading port 2 of the above-described heat treatment apparatus, and a carrier C holding wafers W is carried into the delivery chamber 31 at the side of the automated-guided vehicle. At this time, the lift state 33 is at its upper limit position (indicated by the phantom line) as shown in FIG. 5 and lowered. Then when the bottom of the carrier C (the phantom 0-th holding groove) comes onto the same level as the optical axes a(b) of the wafer detecting unit 5, as shown in FIG. 8A (see FIG. 7) detection signals of the respective photo-emitting/detecting means 71–75 of the reading means 7 are OFF, i.e., an output code of the reading means 7 is (00000), which sets the control unit 70 ready to receive photo-detection signals from the reading unit 7.

The lift stage 33 is further lowered to descend the carrier C, and when the first holding groove 40 in the carrier C comes onto the same level as the optical axes a (b), an output code of the reading means 7 becomes (10000). Based on this code, the control unit 70 recognizes that the first holding groove 40 is located in the detection region of the wafer detecting unit 5 while recognizing absence and presence of the wafers W, based on photo-detection signals outputted by the wafer detecting unit 5, and writes data of the ordinal numbers of the holding grooves 40 and absence and presence of the wafers W in correspondence to each other in, e.g., a memory (not shown). Thus as the lift stage 33 is lowered, absence and presence of the wafers W in the first to the 25th holding grooves in the carrier C are detected.

The carrier C is lowered, and when the phantom 30th holding groove is located on the optical axes a (b), an output photo-detection signal of the wafer detecting unit 5 is OFF because the position where the phantom 30th holding groove is located corresponds to the upper end plate CL of the carrier C. The reason why the 30th holding groove is thus detected is that if no wafer W is held in a carrier C, it is impossible to recognize presence of the carrier C. Presence of a carrier C is recognized by detecting the upper end plate CL of the carrier C. A carrier C is lowered, and when the phantom 31th holding groove 40 (a space above the upper end plate CL) is located on the optical axes a (b), an output code of the reading means 7 is (00000), and the control unit 70 finishes the detection of the wafers W. Then the lift stage 33 is lowered to the lower limit position (indicated by the solid line in FIG. 5), and the carrier C is carried into a stand-by space in the vertical heat treatment apparatus by the carrier transfer mechanism 22.

Figure 9:
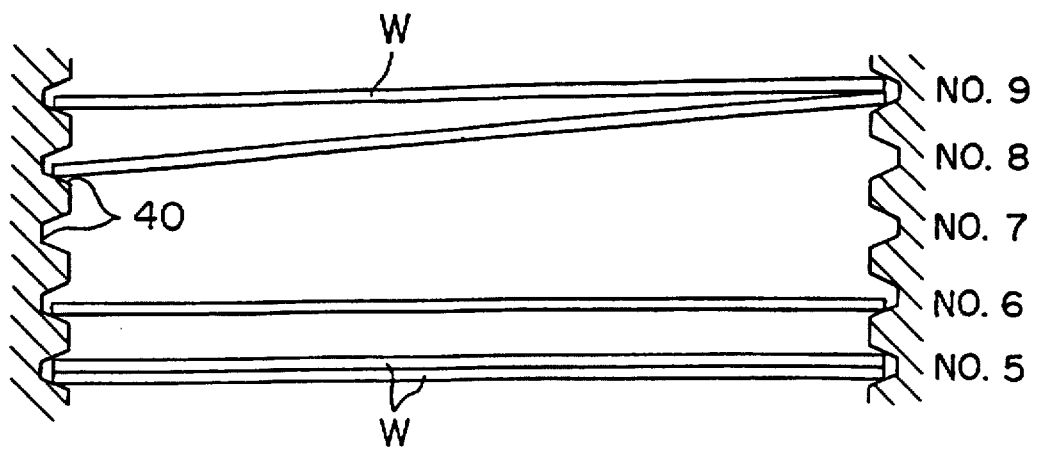
FIG. 9 is a vertical sectional view of the wafer carrier explaining held states of wafers in the wafer carrier.
Figure 10:
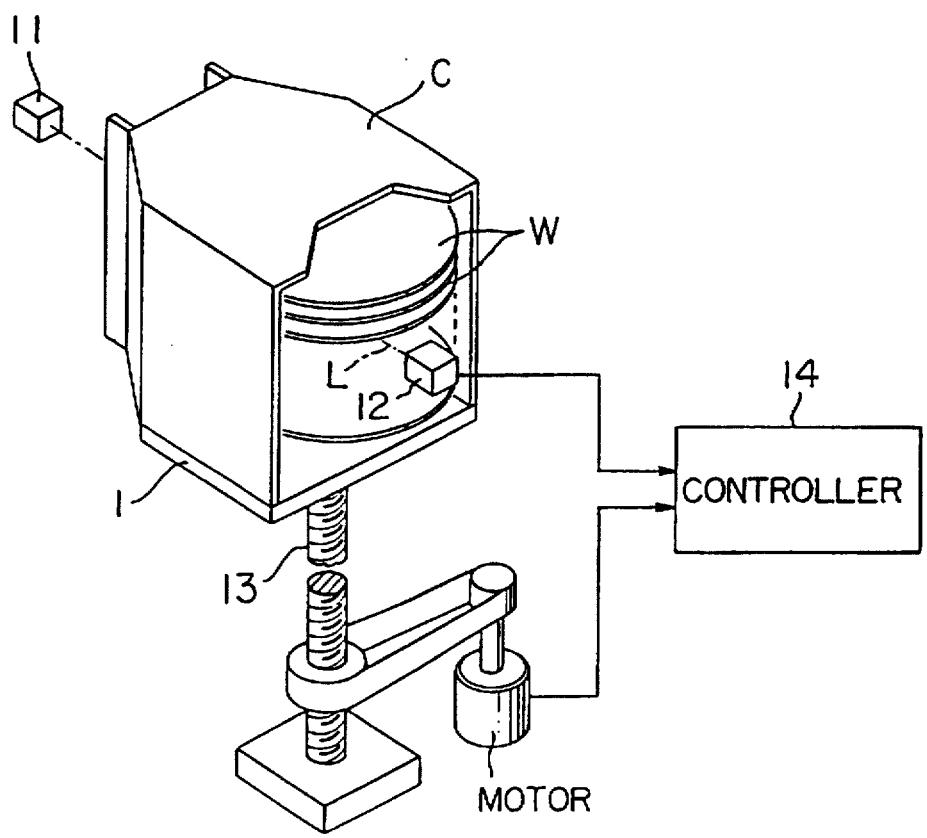
FIG. 10 is a schematic perspective view of a conventional wafer count.

Here if it is assumed that a lift speed of the lift stage 33 is so set that the first to the 25th holding grooves 40 of a carrier C take, e.g., 10 seconds to pass the optical axes a (b), output photo-detection signals of the wafer detecting unit 5 are read, e.g., every 0.2 seconds. This arrangement makes it possible to detect two sheets of wafers overlapped in one holding groove as exemplified in the 5th holding groove 40 in FIG. 9, because the control unit 70 receives successive OFF photo-detection signals from the wafer detecting unit 5 and recognizes the state. The wafer detecting unit 5 comprises two sets of sensors (51, 53; 52, 54) each of which (set) includes the photo-emitting means and the photo-detecting means are disposed respectively on the left and the right for the detection of wafers W at two positions. This arrangement enables one of the sensors of the wafer detecting unit 5 to be ON and the other thereof to be OFF even when a wafer W is not held in correctly opposed holding grooves as exemplified in the 9th and the 8th holding grooves in FIG. 9, and the control unit 70 can correctly recognize this state.

According to the above-described embodiment, information of vertical positions of a carrier C, i.e., information as to which ordinal number of the holding groove in the carrier C is located on the optical axes a (b) of the wafer detecting unit 5 can be recognized based on photo-detection signals supplied by the indication means 6 moved up and down together with the lift stage 33, or by means of the so-called hardware. Thus, even when the up and down movement of a carrier C is halted in mapping due to a failure, such as breakdown of the electric source power, information of a vertical position of the carrier C can be read directly from the indication means 6, and the mapping can be resumed at the vertical position without returning the carrier C to the initial position. In comparison with a conventional case in which pulse numbers are counted by an encoder to obtain information of vertical positions of a carrier by software computation, the above-described embodiment can have higher processing speeds. Types of the controller do not vary the processing speed, which gives higher freedom degrees of selection of the controller, and this facilitates the design. The structure additionally having the elongate indication means 6 and the photo-emitting/detecting means 71–75 arranged vertically one on another makes maximum space saving possible.

In the present invention, the wafer detecting unit 5 may be provided by a reflection sensor or a supersonic sensor. It is possible that the reading means is provided by a reflection sensor, and the indication means 6 is provided by a combination of reflecting portions and non-reflecting portions. The indication means 6 may generate bar codes indicative of ordinal numbers of the holding grooves for respective vertical positions. The reading unit 7 does not essentially include a combination of 5 photo-emitting/detecting means, and may include a combination of more photo-emitting/ detecting means with the indication means formed corresponding to the more photo-emitting/detecting means to thereby enable more information relating to the vertical position of the carrier C to be recognized.

In the present invention, it is possible that the indication means is stationary secured to the transfer chamber, and the reading means is disposed on the lift stage. It is also possible that the carrier C is fixed, and the wafer detecting unit is disposed on the lift stage, so that the wafer detecting unit is moved. In this case, the indication means, for example, is disposed on the lift stage. The present invention is applicable to a case in which a holder corresponding to the container comprises glass substrates (LCDs) for liquid crystal panels arranged one on another, for detection of absence and presence of the glass substrates.

As described above, according to the present invention, absence and presence of objects (wafers) to be transferred in the respective holding grooves in the container can be quickly detected, and, in addition, even when the electric power source breaks down during mapping, the mapping can be immediately resumed at the halted position, which results in improved throughputs.

What is claimed is:

1. An apparatus for detecting objects that are held in a wafer carrier which is movable up and down by a lifting means, and that are to be transferred to a vertical heat treatment apparatus, the wafer carrier holding the objects-to-be-transferred on respective wafer holding grooves having an equal vertical length of 6.35 mm one above another at a vertical interval, said detecting apparatus comprising:

indication means for indicating vertical positions of a wafer carrier disposed on the lifting means, said indication means including optical elements that have optical characteristics which differ from each other, and which are arranged vertically with respect to each other, a combination of light-passing portions and non-light-passing portions, and means defining a lift passage; and reading means for reading indications by the optical elements of said indication means, said reading means defining optical axes that traverse the lift passage of the indication means, said reading means including five photo-emitting means and five detecting means arranged vertically with an equal vertical length of 6.35 mm, wherein a vertical length of the light-passing portions and non-light-passing portions is an integral multiple of the vertical length of each of the photo-emitting means, whereby said indications of said indication means read by said reading means indicate vertical positions of the wafer carrier in a detection region of said detecting apparatus.

2. The apparatus for detecting objects to be transferred according to claim 1, wherein the light-passing portions are rectangular recesses and the non-light-passing portions are uncut parts above and below the respective recesses.

* * * * *